United States Patent
Pirchenfellner et al.

(10) Patent No.: US 9,000,830 B2
(45) Date of Patent: Apr. 7, 2015

(54) METHOD AND APPARATUS FOR PROTECTING TRANSISTORS

(75) Inventors: Jügen Pirchenfellner, Wartberg/Aist (AT); Günter Achleitner, Sattledt (AT); Stephan Holzinger, Scharnstein (AT); Walter Pammer, Bad Hall (AT)

(73) Assignee: FRONIUS International GmbH, Pettenbach (AT)

( * ) Notice: Subject to any disclaimer, the term of this patent is extended or adjusted under 35 U.S.C. 154(b) by 0 days.

(21) Appl. No.: 13/264,449

(22) PCT Filed: Apr. 19, 2010

(86) PCT No.: PCT/AT2010/000118
§ 371 (c)(1),
(2), (4) Date: Oct. 14, 2011

(87) PCT Pub. No.: WO2010/127374
PCT Pub. Date: Nov. 11, 2010

(65) Prior Publication Data
US 2012/0032729 A1 Feb. 9, 2012

(30) Foreign Application Priority Data
May 8, 2009 (AT) .................................. A 706/2009

(51) Int. Cl.
*H03K 17/56* (2006.01)
*H03K 17/16* (2006.01)
(Continued)

(52) U.S. Cl.
CPC ............... *H03K 17/165* (2013.01); *H02M 1/38* (2013.01); *H03K 17/6871* (2013.01); *H03K 17/567* (2013.01); *H03K 19/00361* (2013.01)

(58) Field of Classification Search
USPC ................. 327/419, 427, 423, 424, 587, 588; 361/98, 18; 363/56.04
See application file for complete search history.

(56) References Cited

U.S. PATENT DOCUMENTS 4,092,692 A * 5/1978 Smith et al. ...................... 361/94
4,310,866 A * 1/1982 Wirth .............................. 361/88
(Continued)

FOREIGN PATENT DOCUMENTS

EP 2 048 567 4/2009

OTHER PUBLICATIONS

International Search Report of PCT/AT2010/000118, date of mailing Jul. 26, 2010.
(Continued)

*Primary Examiner* — Matthew Nguyen
*Assistant Examiner* — Afework Demisse
(74) *Attorney, Agent, or Firm* — Collard & Roe, P.C.

(57) ABSTRACT

The invention relates to a method and to an apparatus for protecting transistors (S1, S3; S2, S4) arranged in at least one path, wherein transistors (S1, S3; S2, S4) connected in series to which an input voltage (Ue) is applied are arranged in a path (2), and the transistors (S1, S3; S2, S4) of a path are alternately switched between a conductive state and a blocking state in order to generate an output voltage (Ua) at the center of the path. In order to prevent both transistors (S1, S3; S2, S4) of a path from triggering, the blocking state of the second transistor (S3; S4) of the path is checked before switching a transistor (S1; S2) into the conductive state, and the switching is released by way of a signal generated during the check.

16 Claims, 1 Drawing Sheet

Figure 1:
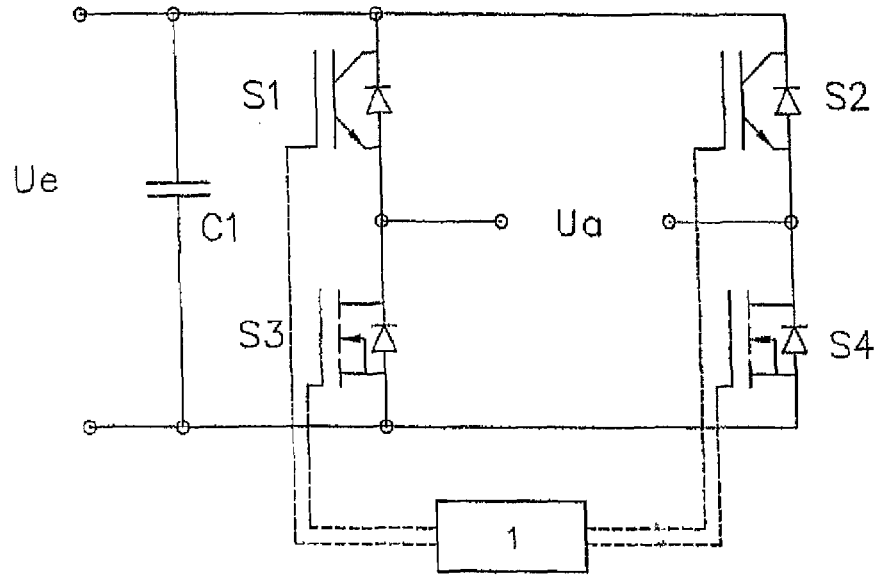

(51) Int. Cl.
*H02M 1/38* (2007.01)
*H03K 17/687* (2006.01)
*H03K 17/567* (2006.01)
*H03K 19/003* (2006.01)

(56) References Cited

U.S. PATENT DOCUMENTS

| | | | | | |
|---|---|---|---|---|---|
| 4,331,994 | A | * | 5/1982 | Wirth | 361/56 |
| 5,105,328 | A | * | 4/1992 | Schoofs | 361/91.5 |
| 5,111,378 | A | * | 5/1992 | Nowak et al. | 363/98 |
| 5,375,028 | A | * | 12/1994 | Fukunaga | 361/93.7 |
| 5,465,188 | A | * | 11/1995 | Pryor et al. | 361/18 |
| 5,737,169 | A | | 4/1998 | Sellers | |
| 6,060,948 | A | * | 5/2000 | Tarantola et al. | 327/589 |
| 6,111,458 | A | * | 8/2000 | Ideler | 327/588 |
| 6,252,440 | B1 | * | 6/2001 | Sushihara et al. | 327/110 |
| 7,843,675 | B2 | * | 11/2010 | Hirata | 361/93.1 |
| 8,144,444 | B2 | * | 3/2012 | Horsky et al. | 361/111 |
| 2002/0105311 | A1 | * | 8/2002 | Rutter et al. | 323/283 |
| 2005/0258890 | A1 | * | 11/2005 | Miyazaki | 327/427 |
| 2008/0246519 | A1 | * | 10/2008 | Suzuki et al. | 327/141 |

OTHER PUBLICATIONS

Office Action of Austrian Priority Application A 706/2009 dated Dec. 30, 2009, copy enclosed with English translation of relevant part.
Data Sheet of COOLMOS of Advanced Power Technology® 050-7239 Rev B 3-2006 of the types APT60N60BCS, APT60N60BCSG, APT60N60SCS, APT60N60SCSG, total of five (5) pages. (see www.advancedpower.com) (Spec, p. 7).

* cited by examiner

METHOD AND APPARATUS FOR PROTECTING TRANSISTORS

CROSS REFERENCE TO RELATED APPLICATIONS

This application is the National Stage of PCT/AT2010/000118 filed on Apr. 19, 2010, which claims priority under 35 U.S.C. §119 of Austrian Application No. A 706/2009 filed on May 8, 2009, the disclosure of which is incorporated by reference. The international application under PCT article 21(2) was not published in English.

The invention relates to a method for protecting transistors arranged in at least one path, wherein two transistors connected in series to which an input voltage is applied are arranged in a path, and the transistors of a path are alternately switched between a conductive state and a blocking state in order to generate an output voltage at the center of the path.

The invention also relates to an apparatus for protecting transistors arranged in at least one path, wherein two transistors connected in series to which an input voltage is applied are arranged in a path, wherein the transistors are arranged for an alternate switching between a conductive state and a blocking state in order to generate an output voltage formed at the center of the path.

U.S. Pat. No. 5,737,169 A shows a circuit for protecting a field effect transistor from overheating, wherein the drain voltage is determined and is blocked if a threshold of the gate terminal of the transistor is exceeded. A simultaneous triggering of two transistors connected in series in a path cannot be prevented by means of said circuit.

The object of the invention is to protect two transistors connected in series, which are alternately switched between a conductive state and a blocking state, from a simultaneous switching into the conductive state.

The object of the invention is solved in accordance with the method in that the blocking state of the second transistor is checked before switching a transistor into the conductive state and that the switching is released by way of a signal generated during the check. Due to the fact that the switching process of the transistor is carried out in dependence on the state of the other transistor arranged in the path, it can be guaranteed that the two transistors connected in series will by no means be in the conductive state simultaneously, and thus a short circuit is avoided. As a result thereof the use of transistors in different applications can be rendered possible and consequently the power dissipation can be minimized and the efficiency can be increased. Also a reliable operation of the circuit constructed with the transistors can be guaranteed, as the transistors will be switched into the conductive state only at certain times so that an undefined behavior of the circuit is excluded.

Advantageously, the check is carried out at least two blocking transistors of a path by way of a voltage measurement and an evaluation circuit.

During the check, the potential at the center of the path can be predefined by a voltage divider connected in parallel with the transistor of a path. Thereby a defined potential as a starting point for the check is created.

According to a further feature of the invention, the predefined potential is compared with a reference voltage and thereby the signal is generated which will be used for releasing the switching of the transistor.

The generated signal preferably comprises two different states, wherein the switching is released in case of one state, the so-called release state.

The switching of the transistor of a path will be carried out by a control when the signal generated during the check has the release state at a defined switching time.

The object of the invention is also solved by an above-mentioned apparatus in which there is arranged at least one measuring device for each path which is designed for checking the blocking state of a transistor before switching the second transistor into the conductive state. Such a protective device or protective circuit is characterized by its special simplicity.

When a potential is predefined at the center of the path by a voltage divider connected in parallel with the transistor, and when the voltage divider is connected with the measuring device so that the predefined potential is supplied to the measuring device, it can be guaranteed that the checking circuit will not undesirably generate a release signal. This can for instance occur during start-up or in case of smaller powers.

Advantageously, the measuring device is connected with a control for the transistors, and the measuring device is designed for generating a signal for the switching of the transistor.

Advantageously, one transistor in a path is formed by an insulated gate bipolar transistor (IGBT) or a metal-oxide semiconductor field effect transistor (MOSFET) and the second transistor of the path is formed by a metal-oxide semiconductor field effect transistor (MOSFET).

Figure 2:
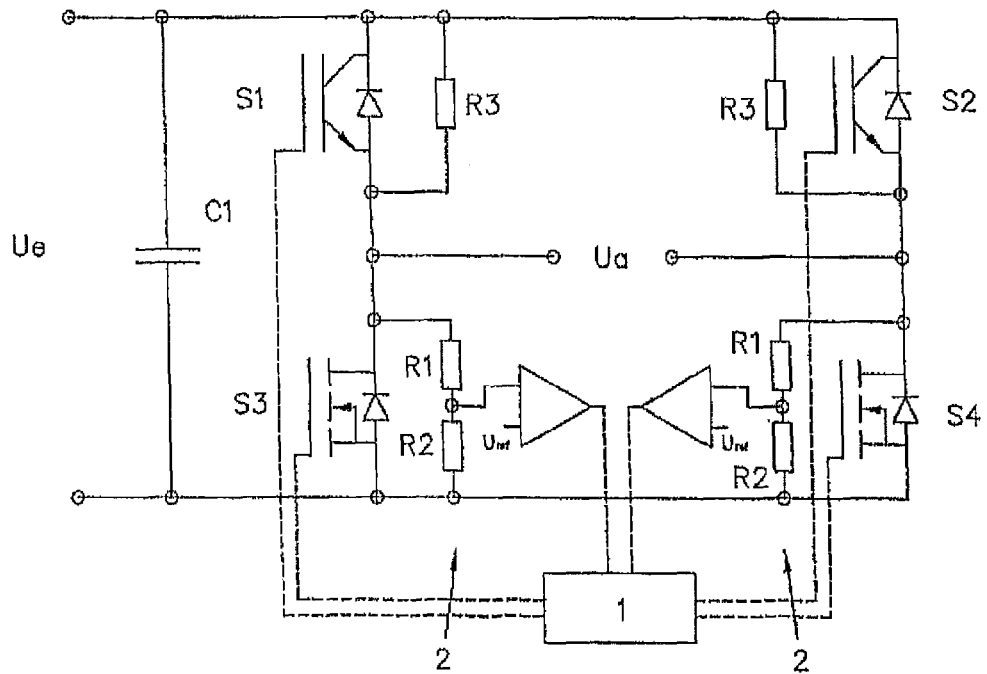

The present invention will be explained in more detail by means of the attached schematic drawings, in which:

FIG. 1 shows a schematic representation of a known full bridge with transistors as switching elements; and FIG. 2 shows a schematic representation of a full bridge including the inventive protection for the transistors.

As becomes evident from FIG. 1, an output stage formed by a full bridge is formed through a first path comprising the transistors S1 and S3 and a second path comprising the transistors S2 and S4. The transistors of a path are connected in series. From the input voltage Ue an output voltage Ua is generated which can be tapped off between the centers of the paths. For this purpose, the transistors of a path are driven diametrically opposed or alternately by a control 1. Accordingly, in the full bridge which is shown as an example two transistors, respectively, of different paths are driven simultaneously. The number of the simultaneously driven transistors is correspondingly matched with the circuit used (full bridge, half-wave rectifier, bridge-connected rectifier or the like). In case of the represented full bridge, from the DC voltage applied at the capacitor C1 as an input voltage Ue from the intermediate circuit of an inverter a positive half wave of an output voltage Ua is generated via the transistors S1 and S4 and a negative half wave is generated via the transistors S2 and S3. In this connection, during the generation of the positive half wave the transistors S1 and S4 are conductive and the transistors S2 and S3 are blocked. For the generation of the negative half wave, the transistors are correspondingly switched by the control 1 so that the transistors S1 and S4 are blocked and the transistors S2 and S3 are conductive. Thus, an AC voltage is generated as the output voltage Ua which can be fed into the grid, as is known for inverters from prior art. At defined switching times during the switching process the transistors S1 to S4 are blocked for a short time so that substantially the potential is determined by the grid and the output stage is in a so-called non-regular operation. Thus, also corresponding interferences from the grid can effect a potential at the center of the path, at which the flyback diodes of the transistors S1 to S4 are conducting. The flyback diodes can also become conductive by their so-called "reverse recovery" characteristic in reverse direction in that a high current change di/dt is caused by switching the transistor connected therewith in series into the conductive state. Due to internal capacitances of the transistor, the rapid change of the drain voltage, resulting therefrom, can lead to a self-opening under control or self-switching into the conductive state. Possibly, this can lead to a short circuit of C1 or of the input voltage Ue, if for instance the transistor S1 (S2) is switched into the conductive state, when the flyback diode of the transistor S3 (S4) is conductive due to the potential caused by the grid. This would lead to a destruction of the transistors. In this connection, the flyback diode is, in particular when transistors like MOSFETs are used, an internal diode which results from the layer construction of the structures of said transistors, as is generally known from prior art.

In order to avoid an above-mentioned state, according to the invention it is provided that the state of the flyback diode of the transistors S3 or S4 is checked before the transistors S1 or S2 connected in series in the path are switched into the conductive state. For this purpose, as becomes evident from FIG. 2, in the first place there is carried out a predefining of the potential of the input voltage Ue at the center of the path—for instance a symmetrization or a halving from 350 V to 175 V, so that substantially between the transistors S1 and S3 there is applied half the potential of the input voltage Ue. This can be carried out by means of a voltage divider with two resistors R1 and R3. As these resistors are short-circuited by the switching of the transistors into the conductive state, the predefining of the potential will only be made in the non-regular operation. In order to be able to monitor a change of the potential brought about in the non-regular operation by which the potential is defined, secondly there is provided a measuring device 2 with a voltage measurement. Said voltage measurement is preferably carried out at the transistors S3 and S4 so that the transistors S1 and S2 cannot be switched into the conductive state in case the flyback diodes of the transistors S3 and S4 would become conductive by a change of the potential. Thus, the voltage measurement measures for instance the drain-source voltage of a MOSFET or the predefined potential, both being an indication of the conductivity of the flyback diode of the transistor. Thus, when the potential falls, this will be detected by the voltage measurement which constantly measures the potential in the non-regular operation. And the measuring device 2 generates a signal from the voltage measurement and an evaluation circuit—for instance a comparator. Said signal can in particular be a square wave signal from the state (HIGH or LOW) of which the control 1 can infer the information whether the transistor S1 (S2) can be switched into the conductive state or not.

In this connection, the voltage measurement is formed by a voltage divider which supplies to a comparator the voltage of a resistor R2 which is connected in series with R1 and which is substantially smaller than the resistor R1 and, thus, correspondingly reduces the defined potential. The comparator compares said voltage measured at R2 with a reference voltage $U_{ref}$ and generates the signal. If the voltage measured at R2 is smaller than the reference voltage $U_{ref}$, then the output of the comparator and thus also the generated signal have a LOW state. But if the voltage measured at R2 is larger than the reference voltage $U_{ref}$, then the output and thus the generated signal have a HIGH state which corresponds to the release state for the switching of the transistor S1 (S2). Accordingly, if the potential has fallen under a set threshold (for instance 90V), then the generated square wave signal has a LOW state. If now the defined switching time coincides with such a point of time of the square wave signal, the transistor S1 (S2) will not be switched into the conductive state—i.e. the switching will not be released. This can be attributed to the fact that it has been recognized that the potential has a falling tendency through which the flyback diode of the transistor would become conductive very soon. Accordingly, the control 1 waits until the signal delivers a HIGH state so that the switching can be carried out. Thus, the point of time of the switching will be deferred, for instance to the next defined switching time. When, however, the potential lies above the threshold at the switching time, then the transistor S1 (S2) will be switched into the conductive state, i.e. the switching will be released.

By way of such a voltage measurement—in particular by the permanent measuring of the potential—a rapid change of the voltage can be detected so that also changes in the nanosecond range can be detected. Such rapid changes of the voltage are in particular caused by asymmetries and superimposed "surges", like lightning flashes and surge voltages of the AC voltage in the zero crossing.

Consequently, with the inventive method and the inventive apparatus there can be guaranteed that the transistor S1 (S2) will only then be switched into the conductive state when the second transistor S3 (S4) of the path is blocked. Thus, also in case of rapid changes of the potential in the non-regular operation it is avoided that an undefined switching of the transistors is carried out. Such rapid changes of the potential in the non-regular operation are in particular caused by the simultaneous switching-on of the transistors connected in series, i.e. when during the switching of a transistor into the conductive state the flyback diode of the other transistor is conductive. Here it is also spoken of a direct switching to the conductive flyback diode of the transistor. Said rapid changes cause an undesired switching-on of the component because of the drain-gate capacitance of the transistors. According to the invention there will always take place a secure switching of the states, and it is guaranteed that the input of the output stage—i.e. the intermediate circuit voltage—will not be short-circuited. In this connection, the method according to the invention is independent of the fact whether, like in the described embodiment, a DC voltage is converted into an AC voltage or whether an AC voltage is converted into a DC voltage.

The method according to the invention is in particular of importance when such types are used as the transistors S3 and S4 which cause an extremely low power dissipation. Such transistors have a very low drain-source on-state resistance $R_{DS(on)}$ so that they react very sensitively to changes of the potential. This is for instance the case when transistors of the type COOLMOS of Advanced Power Technology® are used. From the data sheet of said transistors (see www.advanced-power.com) 050-7239 Rev B 3-2006 of the types APT60N60BCS, APT60N60BCSG, APT60N60SCS, APT60N60SCSG it can be inferred that it is not advisable to use said types when rapid current changes or changes of the potential are to be expected. On the other hand, said transistors, however, enable a substantially better efficiency, and in accordance with the invention they can be employed in output stages of inverters, battery chargers, welding apparatus or the like.

The invention claimed is:
1. A method for protecting transistors arranged in at least one path, the method comprising steps of:
   providing at least two transistors connected in series and arranged in the at least one path,
   applying an input voltage to the at least two transistors,
   alternately switching the at least two transistors between a conductive state and a blocking state in order to generate an output voltage at a center of the at least one path, for protection against a simultaneous conductive state of the at least two transistors, checking a blocking state of at least one second transistor of the at least two transistors and thereafter switching at least one first transistor of the at least two transistors into a conductive state, and releasing the switching by way of a signal generated during the check, said signal comprising a first state and a second state, checking a status of at least one flyback diode of said at least two transistors before another of said at least two transistors is switched into a conductive state;

defining a potential at a center of a path via a voltage divider having at least two resistors coupled in parallel with at least one transistor; and comparing said defined potential with a reference voltage to determine a change in potential to determine whether to initiate switching of at least one transistor wherein the switching is released in the first state and the first state comprises a release state, and wherein the switching is carried out by a control when the generated signal has the release state at a defined switching time.

2. The method according to claim 1, wherein the check is carried out of a blocking state of at least two transistors of the at least one path by way of a voltage measurement and an evaluation circuit.

3. The method according to claim 2, wherein during the check, a potential at the center of the at least one path is predefined by a voltage divider connected in parallel with the at least one second transistor.

4. The method according to claim 3, wherein the potential is compared with a reference voltage such that the signal is generated.

5. The method as in claim 1, wherein said step of checking a flyback diode occurs before at least one of said at least two transistors are switched into a conductive state.

6. The method as in claim 1, wherein said step of checking a flyback diode occurs during a rapid change in potential during a non-regular operation of said at least two transistors.

7. The method as in claim 1, wherein the status of the flyback diode of a transistor of said at least two transistors is checked in a non-regular operation during which all of said transistors are blocked.

8. An apparatus for protecting transistors arranged in at least one path, the apparatus comprising:

at least two transistors connected in series and arranged in the at least one path, an input voltage being applied to the at least two transistors, wherein the at least two transistors are arranged for alternate switching between a conductive state and a blocking state in order to generate an output voltage at a center of the at least one path, at least one measuring device arranged for the at least one path for protection against a simultaneous conductive state of the at least two transistors, said at least one measuring device being designed for checking the blocking state of a second transistor of the at least two transistors before switching a first transistor of the at least two transistors into the conductive state, a control for the at least two transistors, the control being connected with the at least one measuring device, and at least one flyback diode coupled to at least one of said at least two transistors wherein said measuring device is configured to check a status of at least one flyback diode of said at least two transistors before another of said at least two transistors is switched into a conductive state;

a voltage divider, wherein the voltage divider comprises at least two resistors, and wherein said measuring device is configured to read a change in potential to determine whether to switch at least one transistor from a blocking state to a conductive state;

wherein the at least one measuring device is designed for generating a signal for the switching of a transistor of the at least two transistors.

9. The apparatus according to claim 8, further comprising a voltage divider for predefining a potential at the center of the at least one path, connected in parallel with the second transistor, and connected with the at least one measuring device so that the potential is supplied to the at least one measuring device.

10. The apparatus according to claim 8, wherein the first transistor is formed by an insulated gate bipolar transistor or a metal-oxide semiconductor field effect transistor, and wherein the second transistor is formed by a metal-oxide semiconductor field effect transistor.

11. The apparatus as in claim 8, wherein each transistor comprises a flyback diode, and wherein said flyback diode is configured to check before at least one of said at least two transistors is switched into a conductive state.

12. The apparatus as in claim 8, wherein said control is configured to read a voltage across said flyback diode.

13. The apparatus as in claim 8, wherein the status of the flyback diode of the transistor is checked in a non-regular operation during which all of said transistors are blocked.

14. A method for protecting transistors arranged in at least one path, the method comprising steps of:

providing at least two transistors connected in series and arranged in the at least one path;

applying an input voltage to the at least two transistors;

checking a voltage across at least one flyback diode coupled to at least one of said at least two transistors;

determining a blocking state of at least one transistor based upon said voltage across said at least one flyback diode;

switching at least one transistor of the at least two transistors into a conductive state based upon a blocking state of at least another transistor of said at least two transistors;

alternately switching the at least two transistors between a conductive state and a blocking state in order to generate an output voltage at a center of the at least one path, for protection against a simultaneous conductive state of the at least two transistors;

releasing the switching by way of a signal generated during the check, said signal comprising a first state and a second state;

defining a potential at a center of a path via a voltage divider having at least two resistors coupled in parallel with at least one transistor; and comparing said defined potential with a reference voltage to determine a change in potential to determine whether to initiate switching of at least one transistor;

wherein the switching is released in the first state and the first state comprises a release state; and wherein the switching is carried out by a control when the generated signal has the release state at a defined switching time.

15. The method as in claim 14, wherein said voltage across said flyback diode is read by said control.

16. The method as in claim 14, wherein a status of the flyback diode of the transistor is checked in a non-regular operation during which all of said transistors are blocked.

* * * * *